United States Patent [19]
Tecle

[11] Patent Number: 5,326,390
[45] Date of Patent: Jul. 5, 1994

[54] ORGANIC VEHICLE AND ELECTRONIC PASTE

[75] Inventor: Berhan Tecle, Wilmington, Del.

[73] Assignee: E. I. du Pont de Nemours and Company, Wilmington, Del.

[21] Appl. No.: 43,163

[22] Filed: Apr. 5, 1993

[51] Int. Cl.$^5$ .................... C09D 5/24; C09D 105/00; B23K 35/34
[52] U.S. Cl. .................................. 106/208; 106/175; 106/180; 106/178; 106/186; 106/189; 148/26
[58] Field of Search ............... 106/175, 180, 178, 186, 106/189, 208; 148/26

[56] References Cited

U.S. PATENT DOCUMENTS

| | | | |
|---|---|---|---|
| 3,640,741 | 2/1972 | Etes | 106/208 |
| 4,022,633 | 5/1977 | Schneider | 106/208 |
| 4,273,593 | 6/1981 | Mastrangelo | 148/24 |
| 4,475,959 | 10/1984 | Liang et al. | 148/24 |
| 4,919,730 | 4/1990 | Mizuhara | 148/24 |
| 5,271,766 | 12/1993 | Koutlakis et al. | 106/208 |

*Primary Examiner*—David Brunsman

[57] ABSTRACT

An organic vehicle for electronic paste compositions is provided. The organic vehicle contains organo-soluble hydroxyalkyl substituted polysaccharide, a solvent for the polysaccharide, two hydrogen bonding components and inorganic oxide particulates having a surface area of at least 50 m$^2$/g.

7 Claims, No Drawings

ORGANIC VEHICLE AND ELECTRONIC PASTE

FIELD OF THE INVENTION

This invention relates to a vehicle useful in a paste for electronics applications. More particularly, this invention relates to an improved liquid vehicle for suspending inorganic particles for use in thick film and solder paste applications

BACKGROUND

The electronics industry uses particulate-based high-solids pastes in a variety of applications to ultimately provide conductive or dielectric capability in an electronic component. These pastes typically contain inorganic particles and an organic medium or vehicle. The inorganic particles provide the electrical functionality in the ultimate application, i.e., insulative or non-conducting inorganic particles form dielectric parts and conductive inorganic particles, primarily metals, form conductive parts. The organic medium facilitates application and control of the location of the inorganic particles.

After application of the paste, the organic medium is removed by heating and the inorganic particles are sintered or reflowed to form the electrically functional part. To apply the paste to the desired locations in the desired patterns, it is necessary that the paste flow well with the application method employed, such as stencil or screen printing, pressure dispensing etc.

A flow modifying agent or agents is typically included in the paste formulation for the paste to have the appropriate rheology or flow characteristics. Particularly desirable rheological characteristics of the paste include high viscosity, which precludes separation or settling of the inorganic particulate in the paste, dripping, stringiness, and slumping or sagging; plastic flow, which provides shear thinning with a well defined yield point for improved printing characteristics; sufficient tackiness to hold components; good transfer through the printing pattern; and clean release from the screen or stencil.

Effective amounts of flow modifiers, other organic ingredients, and acidic and/or basic activators, are typically so high that the organic ingredients leave a substantial residue on the solder after reflow. For example, rosin is typically present in a solder paste in the amount of by weight 25% or greater by weight in a solder paste vehicle. For thick film paste, ethyl cellulose, as a flow modifier, is typically present in the amount of 1-3% by weight of the paste. This amount of flow modifier leaves a substantial, readily visible and potentially solder-coating residue. It is necessary to wash off the residues since the residues contain various ionic contaminants and other chemical agents which can cause shorting and product failures over time.

Despite the undesirability of these residues, they have been of little concern until recently because chlorofluorocarbon solvents effectively and easily remove the residues. Today, however, considerable efforts are being made to replace such chlorofluorocarbon solvents due to their environmental impact upon the stratosphere. In addition, the failure of cleaning agents to completely remove residues from tight, hard-to-reach spots, and from under components in surface mount or fine pitch assembly operations, makes current methods and proposed alternative cleaners less effective.

Electronic pastes have been disclosed containing a polysaccharide, polysaccharide solvent and polyhydroxylated polysaccharide non-solvent, and optionally, an activator. However, these compositions have been known to be unsatisfactory due to screen plugging, slumping or poor print definition.

Therefore, it is an object of this invention to provide an electronic paste composition in which desirable rheological and flow properties of the paste are achieved with controllable intermolecular interactions. It is also an object of this invention to provide a vehicle for a solder paste which after the solder paste is reflowed leaves a residue that is negligible and innocuous so that no cleaning is necessary.

SUMMARY OF THE INVENTION

The invention is directed to a high resolution, no-clean, screen printable vehicle suitable for an electronic paste composition comprising:
 (a) an organo-soluble hydroxy alkyl substituted polysaccharide;
 (b) a solvent for the polysaccharide;
 (c) a monofunctional hydrogen bonding component selected from the group consisting of:
  (i) alcohol having 1-4 carbon atoms,
  (ii) acid having 1-4 carbon atoms, and
  (iii) amine having a structure:

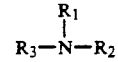

wherein $R_1$, $R_2$ and $R_3$ are independently hydrogen, or alkyl of 1-4 carbon atoms, wherein the sum of $R_1 + R_2 + R_3$ is not more than 4 carbon atoms,
 (d) a monofunctional hydrogen bonding component selected from the group consisting of:
  (i) alcohol having at least 5 carbon atoms,
  (ii) acid having at least 5 carbon atoms, and
  (iii) amine having the general structure:

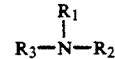

wherein $R_1$, $R_2$ and $R_3$ independently are hydrogen or alkyl, and wherein the sum of $R_1 + R_2 + R_3$ is at least 5 carbon atoms;
 (e) an inorganic oxide particulate material a surface area of at least 50 m²/g.

The invention is further directed to an electronic paste composition containing finely divided inorganic particles suspended in the vehicle set forth above.

DETAILED DESCRIPTION OF THE INVENTION

The improved paste vehicle of the invention comprises a hydroxyalkyl substituted organo-soluble polysaccharide, a solvent for the polysaccharide, two different monofunctional hydrogen bonding components and a high surface area inorganic oxide particulate material.

HYDROXYALKYL SUBSTITUTED POLYSACCHARIDES

High molecular weight polysaccharides are usually referred to as gums. They may be linear or branched, the sugar unit having three hydroxyl groups which are potential sites for a substitution reaction. Introduction of the substituent groups modifies the chemical and physical properties of the polysaccharide. Inter and intramolecular interactions are affected by these substituent groups.

Various classes of polysaccharides include exudate gums, seaweed gums, seed gums, microbial gums, and starch and cellulose derivatives. Seaweed gums include agar, algin, carrageenan, fucoidan, furcellaran, lamanaran and others which are seaweed extracts. Seed gums include guar gum, locust bean gum, quince, psyllium, flux, okra seed gums, tamarind, etc., which are derived from plant seeds. Microbial gums, include xanthan gum, welan gum, gellan gum, rhamsan gum, scleroglucan, dextran which are obtained by fermentation processes, and other starch fractions and derivatives such as amylopectins, dextrins etc., and cellulose derivatives.

However in the present invention hydroxyalkyl substituted organo-soluble polysaccharides are necessary since they exhibit a wide range of properties that are essential for paste formulations of the present invention namely, high suspending power, excellent print definition, excellent paste consistency, no phase separation, and mainly the ability to print to as low as 4 mil pitch features with stencil printing and smaller features with screen printing. These hydroxyalkyl substituted organo-soluble polysaccharides are formed by techniques well known in the prior art employing the polysaccharides referenced above. Illustratively, hydroxyalkyl substitution of exudate gums such as gum arabic, gum ghatti, gum karaya, and gum tragacanth, all derived from plants, may be obtained as described in Polysaccharides, Manssur Yalpani, Elsevier Science Publishers, B. V., 1988, pp. 244–250.

The performance of the hydroxyalkyl substituted organo-soluble polysaccharides is enhanced as its molecular weight increases, particularly when the molecular weight is 1,000,000 daltons or above. A preferred hydroxyalkyl substituted polysaccharide has the following structure:

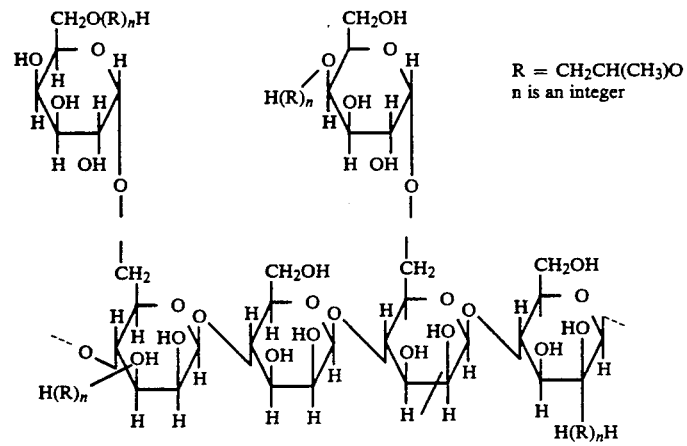

This polysaccharide is also referred to as Structure A.

An important advantage of the hydroxyalkyl substituted polysaccharide gum of this invention is that the gum greatly contributes to the necessary flow and rheological characteristics of a paste composition even though it is present in the paste in a relatively small amount. Further, since there is so little gum present, only a negligible amount of gum remains as residue after sintering or paste reflow.

HYDROXY ALKYL SUBSTITUTED POLYSACCHARIDE SOLVENT

The solvent is a true solvent for the hydroxyalkyl substituted polysaccharide at an elevated temperature of 120° C. although only limited solubility (such as 0.03% by weight may be present at room temperature such as 23° C.). The substituted polysaccharide and solvent conventionally are heated which dissolves the substituted polysaccharide, but does not destroy or decompose it. A degree of hydroxylation and the position of the hydroxyl groups in a typical solvent may affect the ability of the substituted polysaccharides to dissolve in the solvent. Solvents suitable for use in this invention include but are not limited to ethanediols, propanediols, and propanetriols. Preferred polysaccharide solvents are 1,2-ethanediol (also known as ethylene glycol), 1,2-propanediol (also known as propylene glycol), 1,2,3-propanetriol (also known as glycerine) or mixtures thereof. One or more solvents may be used in combination. The polysaccharide solvent is miscible and forms a homogeneous medium with the other vehicle components.

MONOFUNCTIONAL HYDROGEN BONDING COMPONENTS

A combination of two monofunctional hydrogen bonding components is used to obtain a fine pitch screen or stencil printable paste composition. A first component acts as a diluent for the solvated or dissolved hydroxyalkyl substituted polysaccharide which is in the form of a gel and a second component acts as a blocking agent to control intermolecular or intramolecular hydrogen bonding. Once such interactions are controlled the main mode of polymer interaction is considered to be by chain entanglement, chain elongation and chain coiling. Therefore, the recovery is more rapid when subjected to shear stress resulting in paste compositions that have excellent printing and good print definition.

The hydrogen bonding monofunctional first component that acts as a diluent for the solvated or dissolved hydroxyalkyl substituted polysaccharide in the form of a gel is selected from the group consisting of:
(a) alcohols or acids having 1-4 carbon atoms, and
(b) amines having the general structure:

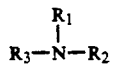

wherein $R_1$, $R_2$ and $R_3$ are alkyl groups, and wherein $R_1+R_2+R_3$ has 1-4 carbon atoms.

Some useful alcohols include: methanol, ethanol, 1-propanol, 2-propanol, 2-methoxyethanol, 1-butanol, sec-Butyl alcohol and t-Butyl alcohol. Some useful acids include carboxylic acids of 1-4 carbon atoms, eg., acetic acid. Some useful amines include: cyclopropylamine, ethylmethylamine, isopropylamine, propylamine, diethylamine, Butylamine, t-butylamine, sec-butylamine, isobutylamine and methylpropylamine.

The hydrogen bonding monofunctional second component that acts as a blocking agent to control intermolecular or intramolecular hydrogen bonding is selected from the group consisting of:
(a) alcohols or acids having at least 5 carbon atoms, and
(b) amines having the general structure:

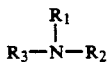

wherein $R_1$, $R_2$ and $R_3$ are alkyl groups, wherein $R_1+R_2+R_3$ has at least 5 carbon atoms.

Some useful alcohols include 1-pentanol, Cyclohexanol, terpineol, 3-methyl-1-butanol, cyclopentanol, 2-ethyl-1-butanol, Benzyl alcohol, m-cresol and (±)trans-2-methylcyclohexanol. Some useful acids include cyclobutanecarboxylic acid, 2-octynoic acid, 2-octenoic acid and cyclopentanecarboxylic acid. Some useful amines include triethylamine, dimethyldodecylamine, piperidine and benzylamine.

INORGANIC PARTICULATE MATERIALS

High surface area metal oxide or nonmetal oxide particulates having a surface area of at least 50 m²/g are employed. Some useful metal oxide or non-metal oxide particulates include $TiO_2$, $ZnO$, $Al_2O_3$, $MgO$, $Fe_2O_3$, $SiO_2$ (fumed silica) and silicate derivatives. Surface area is measured by the BET method which is a well established method for determining surface area of particles and is outlined in J. Am. Chem. Soc., 60, 309 (1938).

CONCENTRATION OF COMPONENTS IN VEHICLE

The vehicle components will generally be present in the following parts by weight: hydroxyalkyl substituted, organic-soluble polysaccharide from 0.1 parts to 1.0 parts, the solvent for the polysaccharide from 10 to 100 parts by weight, a first monofunctional hydrogen bonding component containing not more than four carbon atoms from 1 parts to 8 parts and a second monofunctional hydrogen bonding component containing at least five carbon atoms from 1 parts to 4 parts.

Preferably the weight ratio of the polysaccharide to solvent is present in a ratio of 1:100 to 3:100 while the ratio of the first monofunctional hydrogen bonding component to the second monofunctional hydrogen bonding component is from 1:1 to 8:1 and more preferably 1:1 to 6:1.

OPTIONAL VEHICLE COMPONENTS

The vehicle may also contain an active hydrogen-containing compound (activator) or a mixture of active hydrogen-containing compounds (activator system). An activator preferably becomes active at an elevated temperature to assist in the removal of surface oxides which may form on surface metals. An activator can also enhance solder flow, solder wetting, and should leave a non-corrosive residue.

It is preferred that the activator be essentially fugitive leaving no or minimal residue after reflow. Active hydrogen-containing compounds include hydroxyl substituted amines, mono- and multi- basic acids, hydroxy acids and salts and or derivatives thereof. Hydroxyl substituted amines include aliphatic amines in which the hydroxyl and nitrogen are in vicinal relationship, hydroxyl substituted mononuclear aromatic amines in which the hydroxyl and nitrogen are in a vicinal relationship, hydroxyl substituted polynuclear heterocyclic amines in which the hydroxyl is in the two or eight position relative to the ring of nitrogen, and mixtures thereof. The term vicinal denotes neighboring or adjoining positions on a carbon ring or chain. Some suitable compounds include diethanolamine, triethanolamine, methyldiethanolamine, 2-(2-aminoethylamino) ethanol, diglycolamine, and other alkanol amines, 2-hydroxyquinoline, 8-hydroxyquinoline, alphahydroxymethylpyridine, and N-hydroxyethyl ethylenediamine.

Mono- and multi- basic acids suitable for use in this invention include but are not limited to, formic acid, malonic acid, succinic acid, glutaric acid, hydroxyacids, phenols and derivatives thereof. Particularly preferred activators are malonic acid, substituted malonic acids, and alkanolamines or mixtures thereof.

Optionally, the vehicle can include a small percentage of water, up to about 3 to 5 weight percent of the vehicle without significant detrimental effect on the paste system. The present vehicle can also contain minor amounts of other materials used in conventional fashion without departing from the concept of this invention. Such other materials include preservatives, modifiers, sequestrants, dispersion agents, antibacterial agents, and the like.

ELECTRONIC PASTE COMPOSITIONS

The paste compositions of the invention contain finely divided inorganic particles suspended in the vehicle described above. The inorganic particles may be any of those conventionally included in electronic paste compositions. For example, single or multiphase metals such as tin, lead, silver, bismuth, indium, gold, platinum, palladium, copper, zinc, germanium, silicon, antimony, gallium, phosphorous, alloys thereof or mixtures thereof are suitable. Non-metallic inorganic particles including ceramics, glasses, oxides, sulfides, borides and carbides such as alumina, titanates, zirconates, stannates, manganates, borates, silicates, boro silicates, oxide glasses, lead oxides, cobalt oxides, bismuth oxides, zinc oxides, boron oxides, silica oxides, antimony oxides, magnesium oxides and mixtures thereof are also suitable. The borosilicate glasses can include, but are not limited to, lead borosilicate frits, and bismuth, cadmium, barium, calcium and other alkaline earth borosilicate frits. Oxide glasses can include, but are not limited to, aluminophosphates, aluminophosphosilicates, aluminoborophosphosilicates, phosphoborosilicates and mixtures thereof which can optionally contain alkali or alkaline earth cations to control properties of the glass such as moisture resistance, acid/base resistance and thermal expansion characteristics. Preferred thick film non-metallic inorganic particles are alumina, barium titanate, calcium titanate, strontium titanate, lead titanate, calcium zirconate, barium zirconate, magannite calcium stannate, barium stannate, bismuth titanate, bismuth stannate, bismuth trioxides, iron oxides, zirconium orthosilicate (zircon), aluminum silicates (kyanite and mullite), magnesium orthosilicate (forsterite), lead borosilicates, calcium zinc borosilicates, lead oxides, zinc oxides and silica oxides.

When using mixtures of metals or their alloys, it is possible to adjust properties such as the melting point, tensile strength, fluidity, shear strength, elongation, Brinell hardness, and density, by modifying the relative amounts of the component metals or alloys. Similarly for non-metallic mixtures, it is possible to adjust properties such as the dielectric constant, softening point, hardness, and density, by modifying the relative amounts of the non-metallic components.

Conventional metal or metal alloy solder powders particularly useful for assembly soldering of electronic components include a 63% tin-37% lead solder, or a 62% tin-36% lead-2% silver solder. Other metal or metal alloy solders may also be used, such as alloys of tin-indium, tin-bismuth, or tin-lead-bismuth. Preferred thick film metallic inorganic particles are copper, silver, gold, platinum, palladium and other precious metals.

The amount of non-metallic inorganic particles in a thick film dielectric paste may range from about 65 to about 80 weight percent of the paste composition. However, the amount of metallic inorganic particles in the electronic solder paste may range from about 65 to about 93 weight percent of the paste composition, preferably between 90 and 92 weight percent. In contrast, the amount of metallic inorganic particles in a thick film conductor paste may range from about 75 to about 90 weight percent of the paste composition.

The inorganic particles are normally smaller than 100 mesh (149 micron), and preferably smaller than 200 mesh (74 micron). Powder particles smaller than 325 mesh (44 micron) are also suitable for use in this invention and are preferred in thick film pastes and in some solder pastes.

CONTRAST OF INORGANIC PARTICLES IN VEHICLE vs ADDITIONAL INORGANIC PARTICLES IN ELECTRONIC PASTE

As previously discussed, the metal vehicle or non-metal oxide particles in the vehicle will have a surface area of at least 50 m$^2$/g. These particles are small in comparison to the finely divided inorganic particles additionally contained in the electronic paste which will normally be smaller than 149 microns, preferably smaller than 74 microns such as smaller than 44 microns but with a size greater than 1 micron. An example of the difference in particle size is the particles having a surface area of at least 50 m$^2$/g to the additional particles is 1:1000 (on the basis of diameters).

APPLICATION TECHNIQUE

Application of the paste may be by conventional technique, typically stencil- or screen-printing. A satisfactory solder paste should print through a stencil designed for 50 mil (0.13 cm) pitch patterns, preferably 12 to 25 mil (0.03–0.65 cm) pitch patterns or an 80-mesh (177 micron) or finer screen. A satisfactory thick film paste should print through a 200 to 400 mesh (74 to 37 micron) screen pattern. The paste should not drip between printing operations, nor should it dry or stiffen excessively when held on the screen or stencil for a reasonable period of time. For satisfactory performance the vehicle properties and paste composition should be adjusted to prevent excessive settling out of the powder, but not to interfere with the printing operation. Exclusion of air by blanketing the stencil or screen with an inert gaseous atmosphere and/or by dispensing the paste onto the stencil or screen as required may well enhance the overall performance of the paste.

The stencil or screen printable paste composition may be applied to any suitable substrate, particularly metal or ceramic substrates to form the desired paste. Thereafter, the paste is heated. Any atmosphere may be used e.g. air, but non-oxidizing atmospheres are preferred. Thick film pastes are heated to a temperature sufficient to volatilize the organic medium and sinter the inorganic particles. Solder pastes are heated to a temperature where the solder becomes molten and a highly adherent metallurgical and electrically conductive solder joint is formed.

Alternative to mixing the vehicle and inorganic particles prior to application to a substrate, the vehicle and the inorganic components may be applied separately. This method is particularly useful for the attachment of an electronic component to a printed wiring board wherein either the component or board is precoated with solder. A preferred vehicle for this attachment contains a composition for attaching a metallic lead of an electronic component to a metallization on a printed wiring board, wherein at least the lead or the printed wiring board metallization is precoated with solder, the composition is the vehicle described previously.

EXAMPLES

The following solutions, dispersions, solder paste activators and base solder pastes were prepared as outlined below:

Guar gum solution: To a reaction kettle equipped with a stirrer assembly, 2940 grams of glycerol (Aldrich 19,161-2, lot 059002BX) were transferred. A fine powder of 60 grams of hydroxypropyl guar derivative, Jaguar® 8012 obtained from Hi-Tek Polymers, Inc., Louisville, Ky. was dispersed by slowly adding to the vortex of the stirred glycerol. The kettle was heated to 100° C. As the solution became viscous the temperature was raised to 138° C. The solution was transferred to a large flask and diluted with 5200 grams of methanol. The solution was then filtered through Sparkler-Dacron and filter paper (Whatman 54). Using a rotary evaporator, the methanol was stripped off. Residual methanol was removed by heating the rotary evaporator to 70° C. and 40 mm pressure. This provided a clear transparent solution free of gels and turbidity.

SiO$_2$ dispersion: A Fumed silica dispersion in glycerol was prepared using a 32 oz. wide mouth jar and 1 cm cylindrical burundum milling media. One third of the volume of the jar was filled with the milling media. 450 grams of glycerol were added to the jar. 15 grams of fumed silica, AEROSIL® 200, with surface area of about 200 m$^2$/g, obtained from Degussa were then added in small amounts until all the silica was wetted by rolling the jar on a two roll mill. After all the silica was added the jar was left to roll on the roll mill for about 18 hours.

Activator solution: An activator solution was prepared using 583.10 grams of triethanolamine (J.T. Baker 9468-01, lot D50633) and 116.90 grams of malonic acid (Aldrich M129-6, lot 06631KV). To 1 liter round bottomed flask fitted with a paddle stirrer about 425 grams of the triethanolamine were added first and heated to 70° C. The malonic acid was slowly added so that the temperature remained below 91° C. Then the remainder of the triethanolamine was added.

Base paste composition:

| Ingredient | Amount (%) |
|---|---|
| Jaguar ® 8012 solution | 4.1628 |
| Solder powder alloy of Sn/Pb (63/37) 10 to 45μ size, manufactured by Extramet Industrie, France | 93.6934 |
| Glycerol | 2.1438 |

EXAMPLE 1

A solder paste composition was prepared by hand mixing the following ingredients with a spatula in a small jar:

| Ingredients | Amount (%) |
|---|---|
| Guar gum solution | 4.0000 |
| Solder powder (from Extramet) | 90.0300 |
| Glycerol | 4.8605 |
| SiO2 dispersion | 0.2795 |
| 1-propanol | 0.6500 |
| Dimethyldodecylamine | 0.1800 |

The paste was printed by hand on 2"×2" copper clad glass epoxy laminate coupons using 8 mil stainless steel stencil (IPC A-21, manufactured by ITS, job 21785). The dimensions of the pads and spacing between pads were 2.03 mm×0.33 mm and 0.10 mm–0.35 mm, respectively. A 6 mil (0.15 mm) printing resolution with acceptable slumping was obtained.

EXAMPLE 2

A paste composition was prepared using the following ingredients:

| Ingredients | Amount (%) |
|---|---|
| Base paste composition | 70.8137 |
| Diethylamine | 0.4389 |
| Benzylamine | 0.3305 |
| SiO2 dispersion | 0.4264 |
| Activator solution | 2.0993 |
| Solder powder (from Extramet) | 25.8912 |

The paste was printed as in Example 1. A resolution of 4 mil (0.10 mm) resolution was achieved.

EXAMPLE 3

A similar composition as above was prepared by hand mixing all ingredients. Methanol and terpineol are used as the rheology control components of the composition. The paste formulation is given below.

| Ingredients | Amount (%) |
|---|---|
| Base paste composition | 95.7482 |
| Methanol | 0.6543 |
| Terpineol | 0.4169 |
| SiO2 dispersion | 0.3351 |
| Activator solution | 2.8455 |

The paste was printed as above and a resolution of 4 mil (0.10 mm) was easily achieved.

EXAMPLE 4

A paste was prepared as described above using the ingredients and the amounts given below:

| Ingredients | Amounts (%) |
|---|---|
| Base paste composition | 81.1661 |
| 1-propanol | 0.6459 |
| Cyclohexanol | 0.1742 |
| SiO2 dispersion | 0.2570 |
| Activator solution | 2.5381 |
| Solder powder (from Extramet) | 15.2187 |

When printed as described above this paste also gave a 4 mil (0.10 mm) resolution.

CONTROL

A 0.3% solution of Rhamsan gum obtained from Kelco, a division of Merck & Co. Inc. of 8355 Aero Dr. San Diego, Calif. in glycerol was prepared by dissolving the gum under high shear conditions at 125° C. A slightly yellowish, high viscosity solution was formed. Using this gum solution and solder powder and rheology modifiers the following control paste formulations were prepared:

| Ingredients | Sample A | Sample B | Sample C | Sample D |
|---|---|---|---|---|
| Glycerol | 9.9678 | 9.0933 | 9.0547 | 9.0693 |
| Rhamsan gum | 0.0300 | 0.0274 | 0.0272 | 0.0274 |
| Solder powder* | 90.0022 | 89.9780 | 90.0031 | 89.9798 |
| 1-propanol | — | 0.9013 | — | 0.7156 |
| Terpineol | — | — | 0.9150 | 0.2079 |

*Solder powder was obtained from Extramet. It is Type 2 powder (Particle size range 10 to 45 microns).

The pastes were printed by hand on 2"×2" copper glass epoxy laminate coupons using 8 mil stainless steel stencil (IPC A-21, manufactured by ITS, job 21785). The dimensions of the pads and spacing between pads were 2.03 mm×0.33 mm and 0.10 mm–0.35 mm, respectively. The printing resolution obtained for the control samples was:

Example A: 14 mil (35 mm)
Example B: 14 mil (35 mm)
Example C: 14 mil (35 mm)
Example D: 12 mil (30 mm)

What is claimed is:

1. A high resolution, no-clean, screen printable vehicle suitable for an electronic paste composition comprising:
    (a) an organo-soluble hydroxy alkyl substituted polysaccharide;
    (b) a solvent for the polysaccharides;
    (c) a monofunctional hydrogen bonding component selected from the group consisting of:
        (i) alcohol having 1–4 carbon atoms,
        (ii) acid having 1–4 carbon atoms, and
        (iii) amine having a structure:

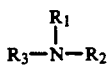

wherein $R_1$, $R_2$ and $R_3$ are independently H or alkyl of 1–4 carbon atoms, wherein the sum of $R_1+R_2+R_3$ is not more than 4 carbon atoms,
  (d) a monofunctional hydrogen bonding component selected from the group consisting of:
   (i) alcohol having at least 5 carbon atoms,
   (ii) acid having at least 5 carbon atoms, and
   (iii) amine having the general structure:

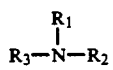

wherein $R_1$, $R_2$ and $R_3$ are independently hydrogen or alkyl, and wherein the sum of $R_1+R_2+R_3$ is at least 5 carbon atoms,
  (e) an inorganic oxide particulate material having a surface area of at least 50 m²/g.

2. The composition of claim 1 wherein the organ-soluble hydroxyalkyl substituted polysaccharide is a hydroxyalkyl substituted seed gum or hydroaxyalkyl substituted guar gum.

3. The composition of claim 1 wherein the solvent is selected from the group consisting of glycerine, propylene glycol, and ethylene glycol.

4. The composition of claim 1 wherein the monofunctional hydrogen bonding component (c) is selected from the group consisting of 1-propanol, ethanol propylamine diethylamine, acetic acid.

5. The composition of claim 1 wherein the monofunctional hydrogen bonding component (d) is selected from the group consisting of terpineol, cyclohexanol, dimethyldodecylamine, benzylamine and cyclopentanecarboxylic acid.

6. An electronic paste composition comprising: finely divided inorganic particles suspended in a high resolution, non-clean, screen printable vehicle comprising:
  (a) an organo-soluble hydroxy alkyl substituted polysaccharide,
  (b) a solvent for the polysaccharide,
  (c) a monofunctional hydrogen bonding component selected from the group consisting of:
   (i) alcohol having 1–4 carbon atoms,
   (ii) acid having 1–4 carbon atoms, and
   (iii) amine having the general structure:

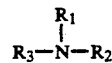

wherein $R_1$, $R_2$ and $R_3$ are independently H or alkyl of 1–4 carbon atoms, wherein the sum of $R_1+R_2+R_3$ is not more than 4 carbon atoms,
  (d) a monofunctional hydrogen bonding component selected from the group consisting of:
   (i) alcohol having at least 5 carbon atoms,
   (ii) acid having at least 5 carbon and
   (iii) amine having the general structure:

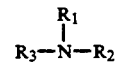

wherein $R_1$, $R_2$ and $R_3$ are independently are hydrogen or alkyl groups, and wherein the sum of $R_1+R_2+R_3$ is at least 5 carbon atoms,
  (e) an inorganic oxide particulate material having a surface area of at least 50 m²/g,
  (f) inorganic particles having a size smaller than 149 microns but greater than 1 micron.

7. The electronic paste composition of claim 6 wherein the inorganic particles comprise from 65 to 93% by weight of the paste.